United States Patent [19]

Kreifels et al.

[11] Patent Number: 5,053,990

[45] Date of Patent: Oct. 1, 1991

[54] PROGRAM/ERASE SELECTION FOR FLASH MEMORY

[75] Inventors: Jerry A. Kreifels, Citrus Heights; Alan Baker, Fair Oaks; George Hoekstra, Santa Clara; Virgil N. Kynett, El Dorado Hills; Steven Wells, Orangevale; Mark Winston, El Dorado Hills, all of Calif.

[73] Assignee: Intel Corporation, Santa Clara, Calif.

[21] Appl. No.: 157,361

[22] Filed: Feb. 17, 1988

[51] Int. Cl.[5] ............................................. G11C 11/407
[52] U.S. Cl. ................................. 364/900; 364/927.8; 364/944.92; 364/954.2; 364/965.2; 364/965.76; 365/218
[58] Field of Search ................ 364/200, 900; 365/201, 365/189

[56] References Cited

U.S. PATENT DOCUMENTS

| | | | |
|---|---|---|---|
| 4,460,982 | 7/1984 | Gee et al. ............................ | 365/201 |
| 4,752,871 | 6/1988 | Sparks et al. ....................... | 364/200 |
| 4,763,305 | 8/1988 | Kuo .................................... | 365/200 |
| 4,811,294 | 3/1989 | Kobayashi et al. ................. | 365/185 |

Primary Examiner—Glenn Gossage
Assistant Examiner—John Loomis
Attorney, Agent, or Firm—Blakely, Sokoloff, Taylor & Zafman

[57] ABSTRACT

A semiconductor flash EPROM/EEPROM device which includes a command port for receiving instruction on a data line and providing control signals to a memory for providing program and erase functions, a method to program and erase the memory. A program sequence is comprised of setting up a program command during a first write cycle, preforming a second write cycle to load address to address register and data to to a data register, programming during a program cycle and writing a program verify command during a third write cycle to verify the programmed data during a read cycle. An erase sequence is comprised of writing a setup erase command during a first write cycle, an erase command during a second write cycle providing the erasure during an erase cycle, writing the erase verify command during a third write cycle which also addresses the address of the memory and providing erase verification during a read cycle. Both the erase and program cycles provide for measured incremental erasing and programming.

6 Claims, 12 Drawing Sheets

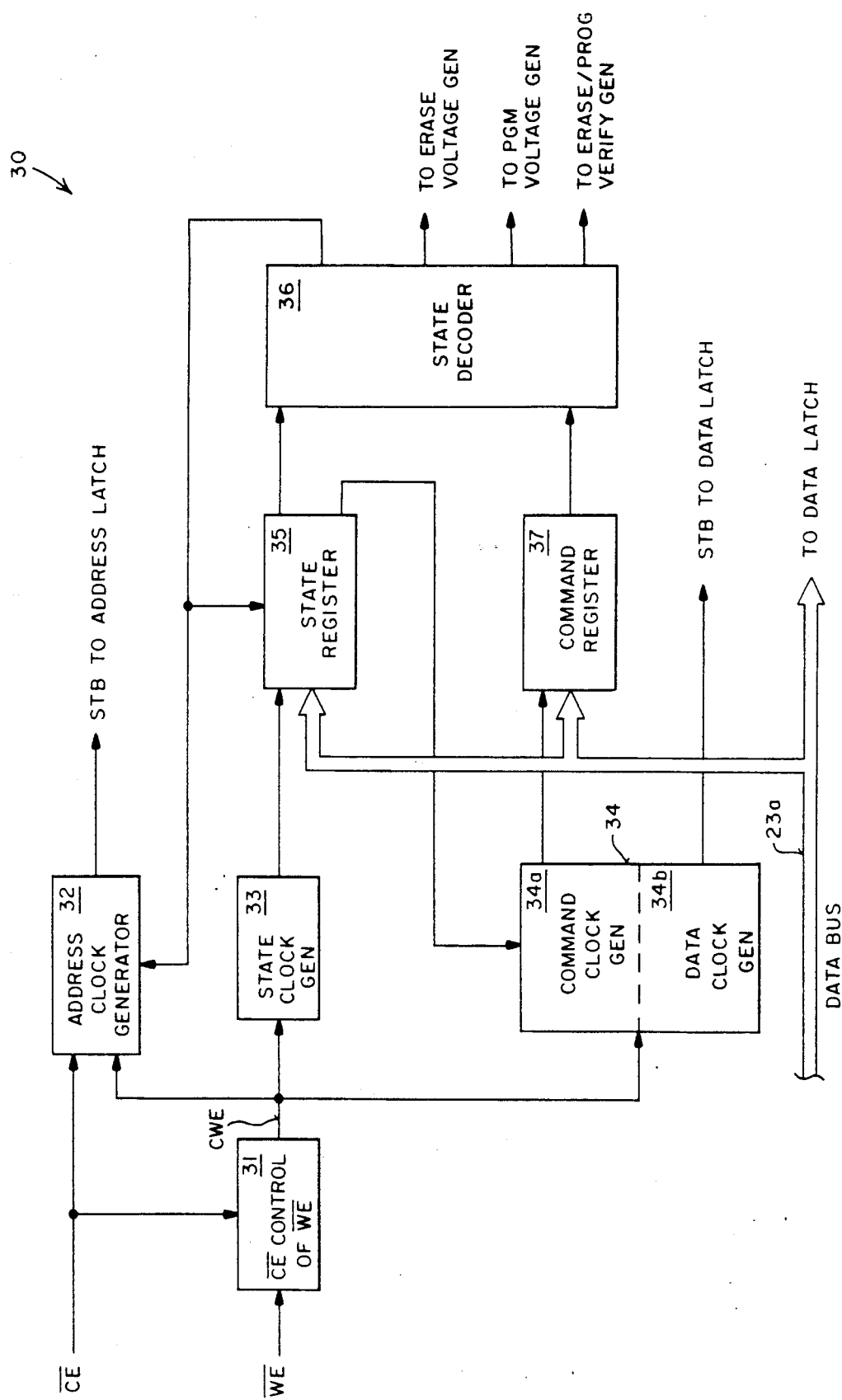
FIG_2

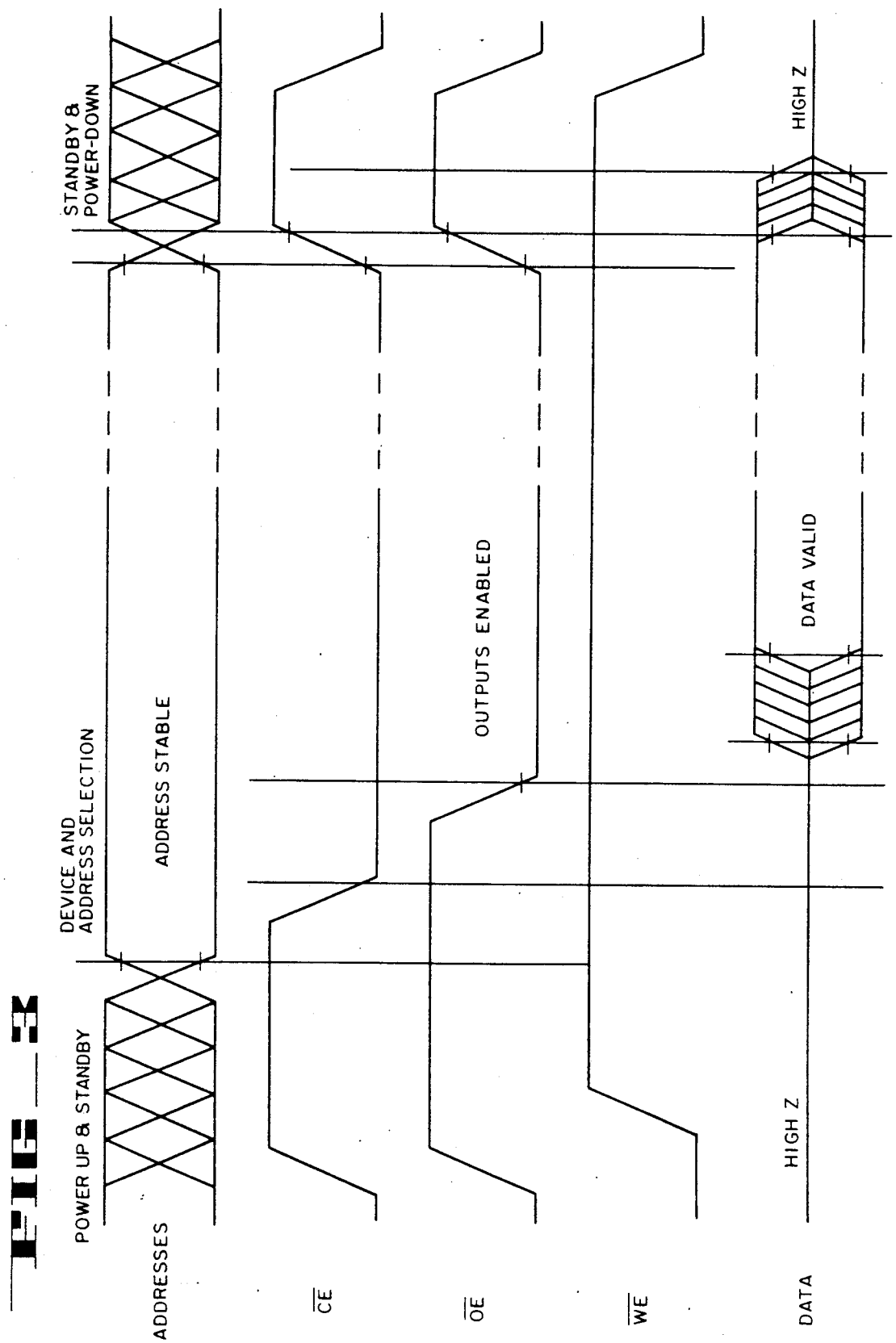
FIG_3

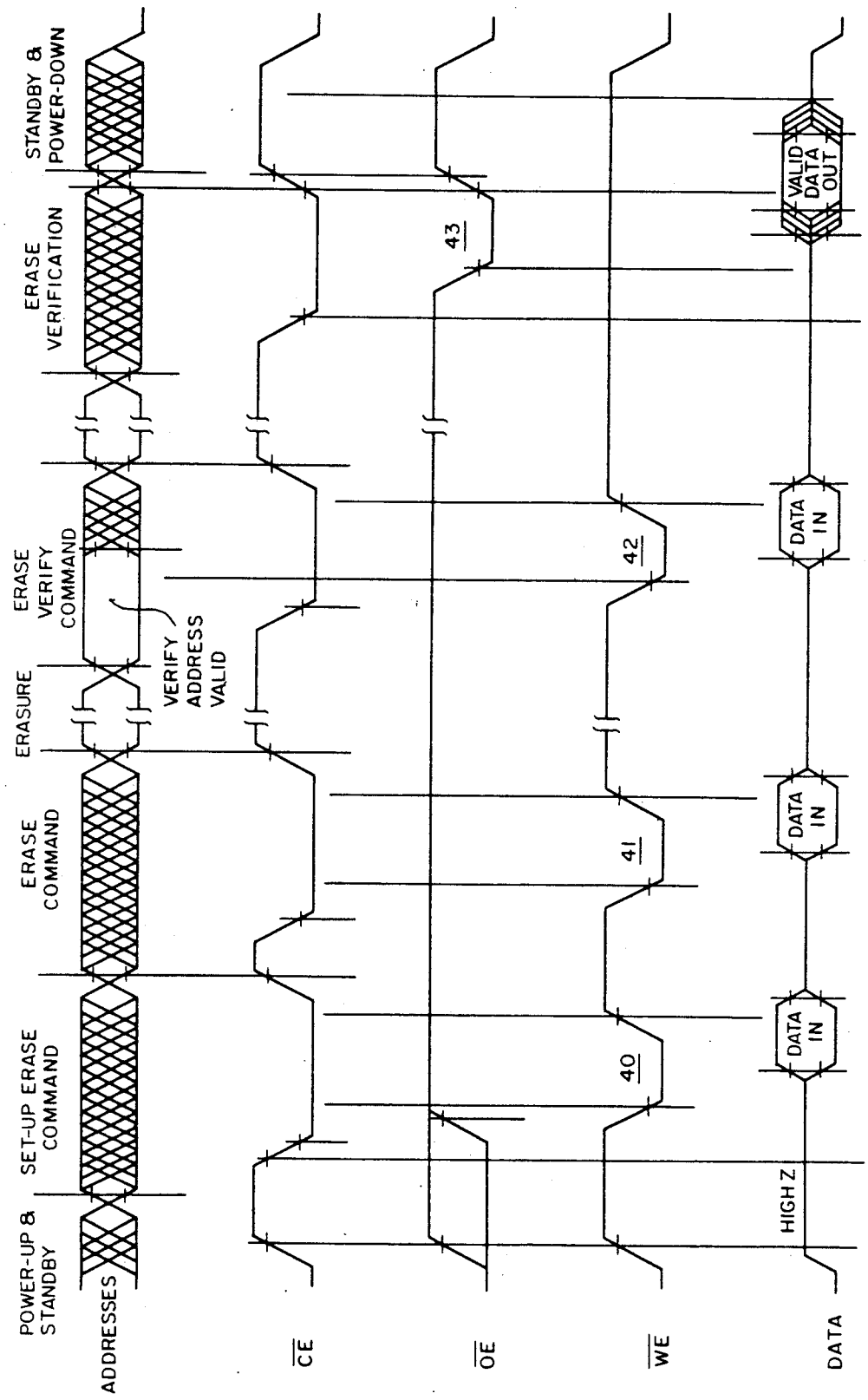

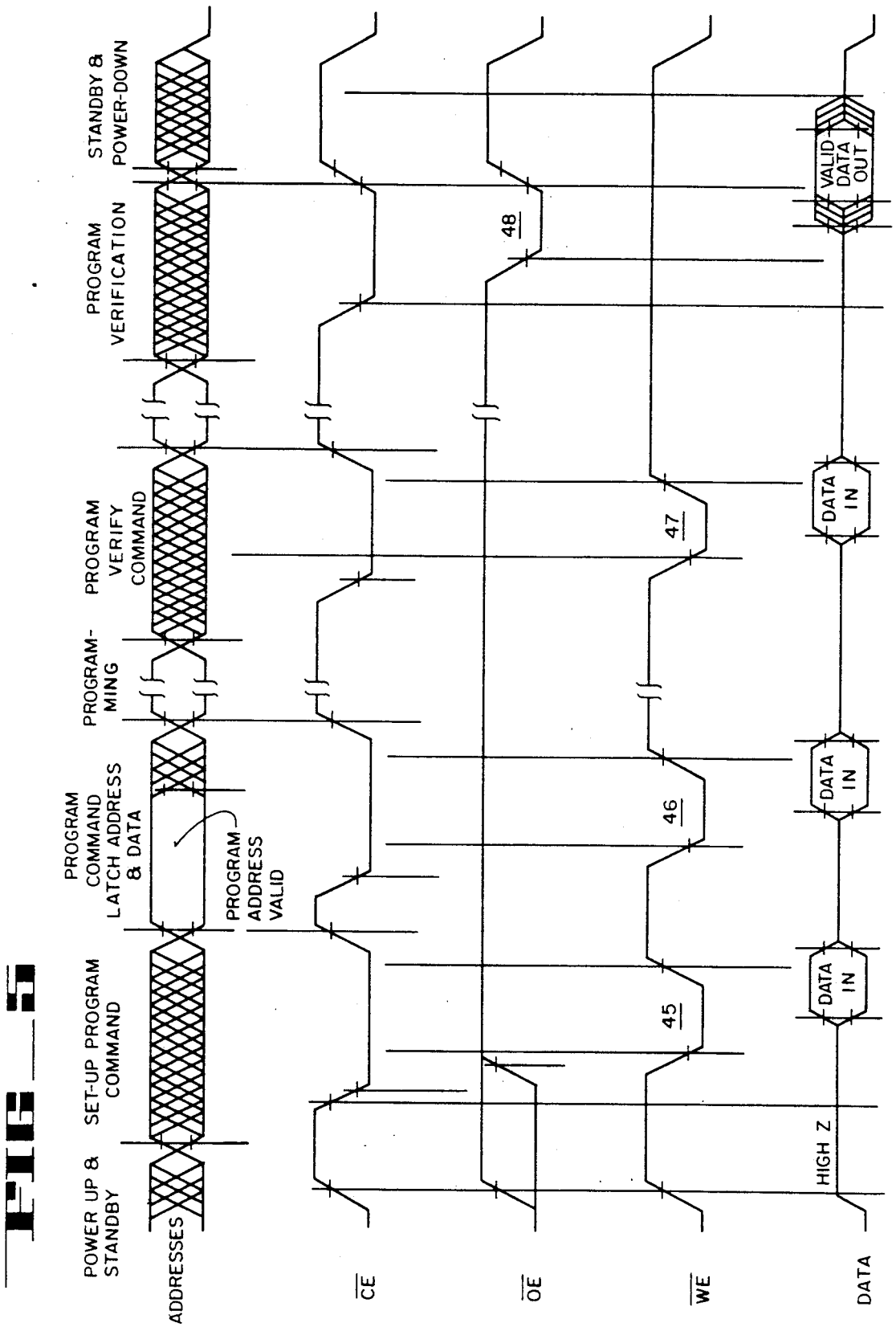

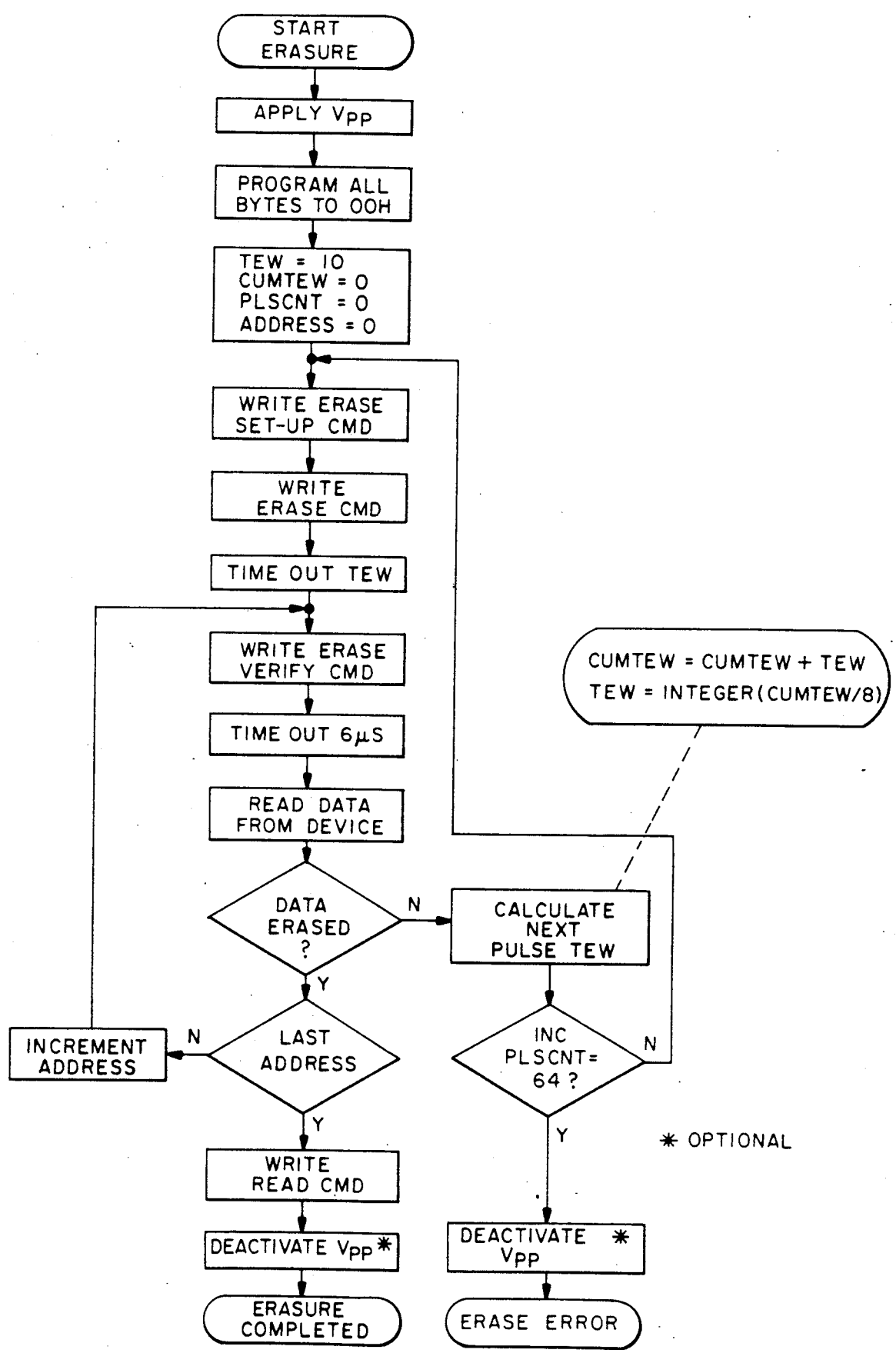

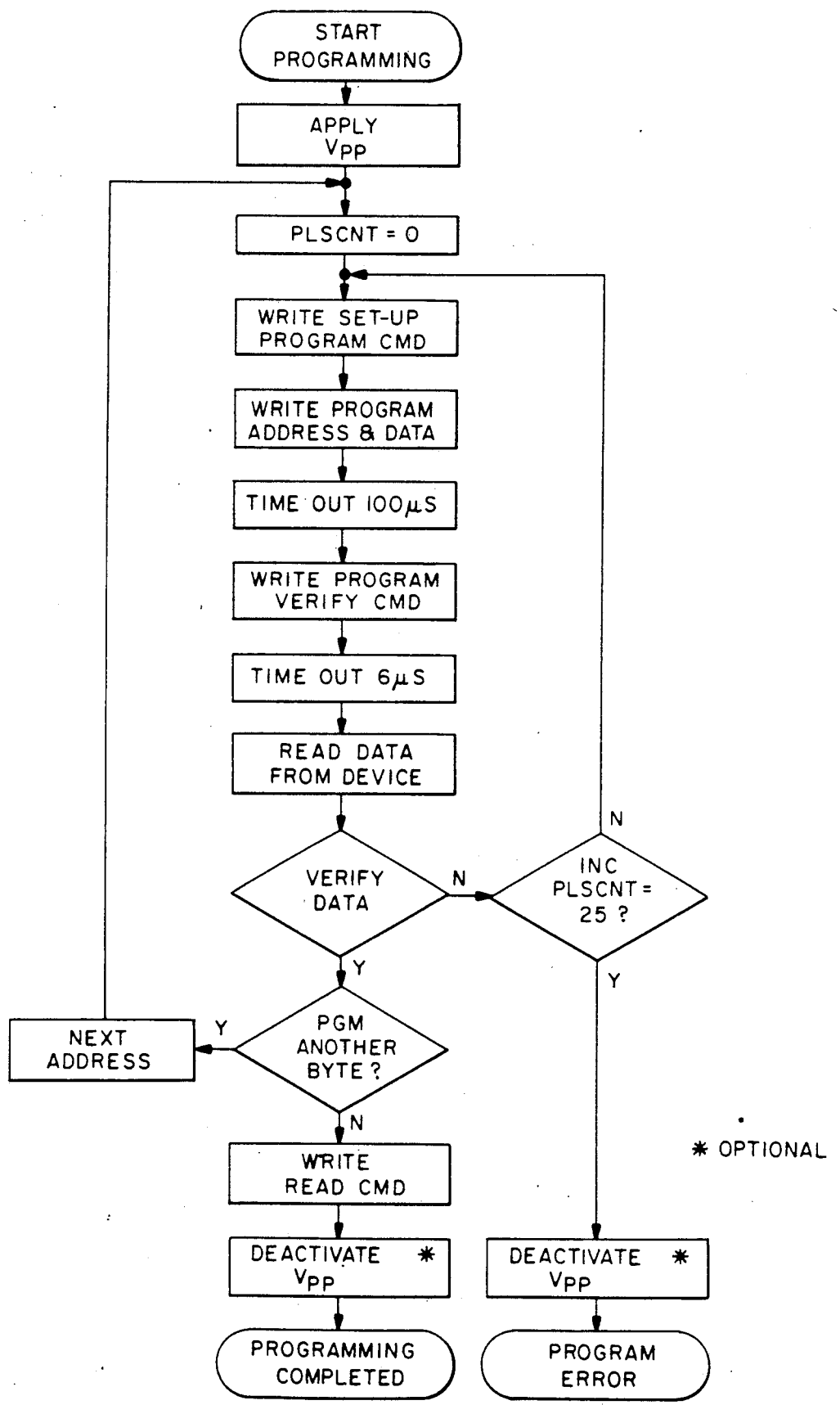

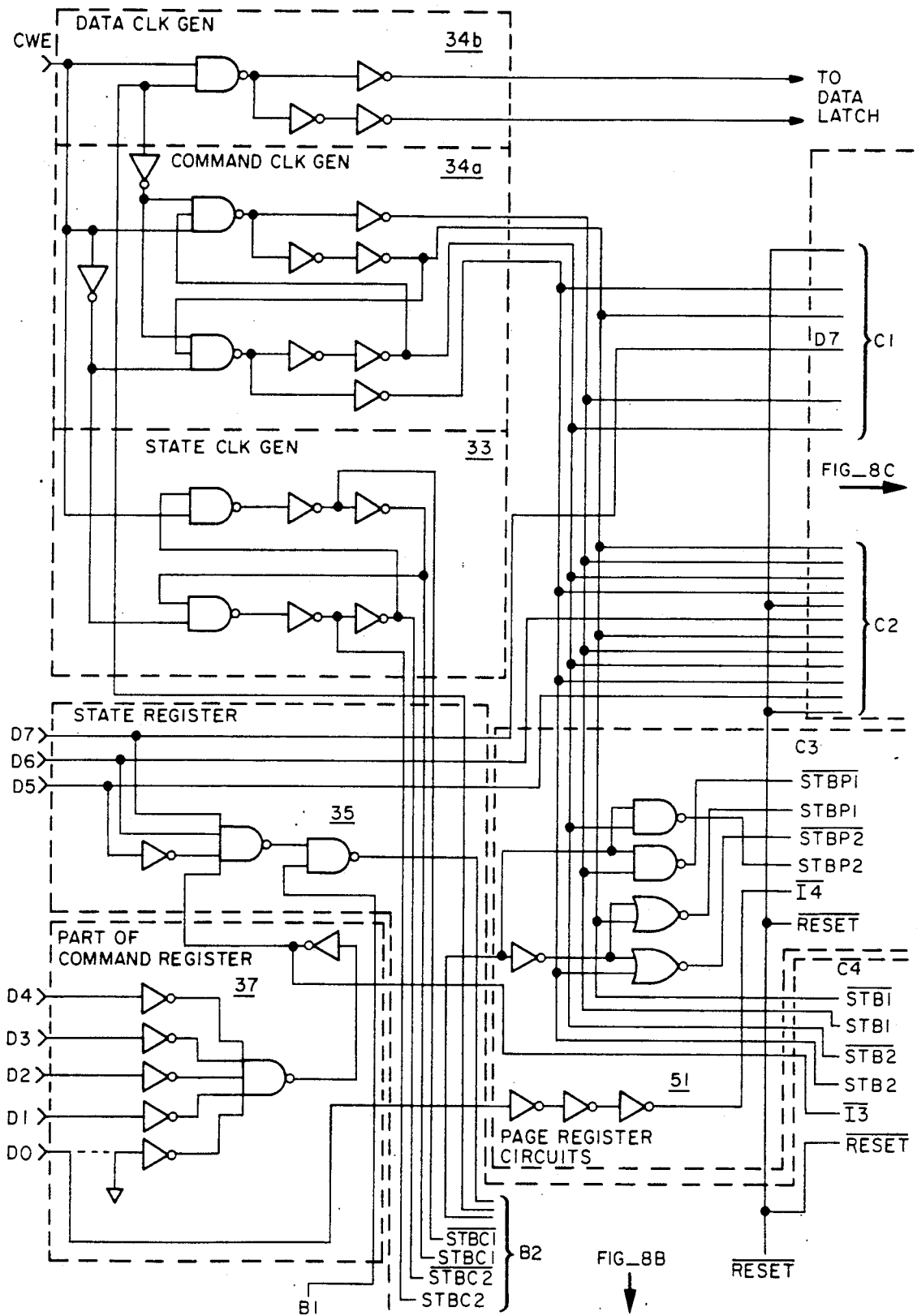

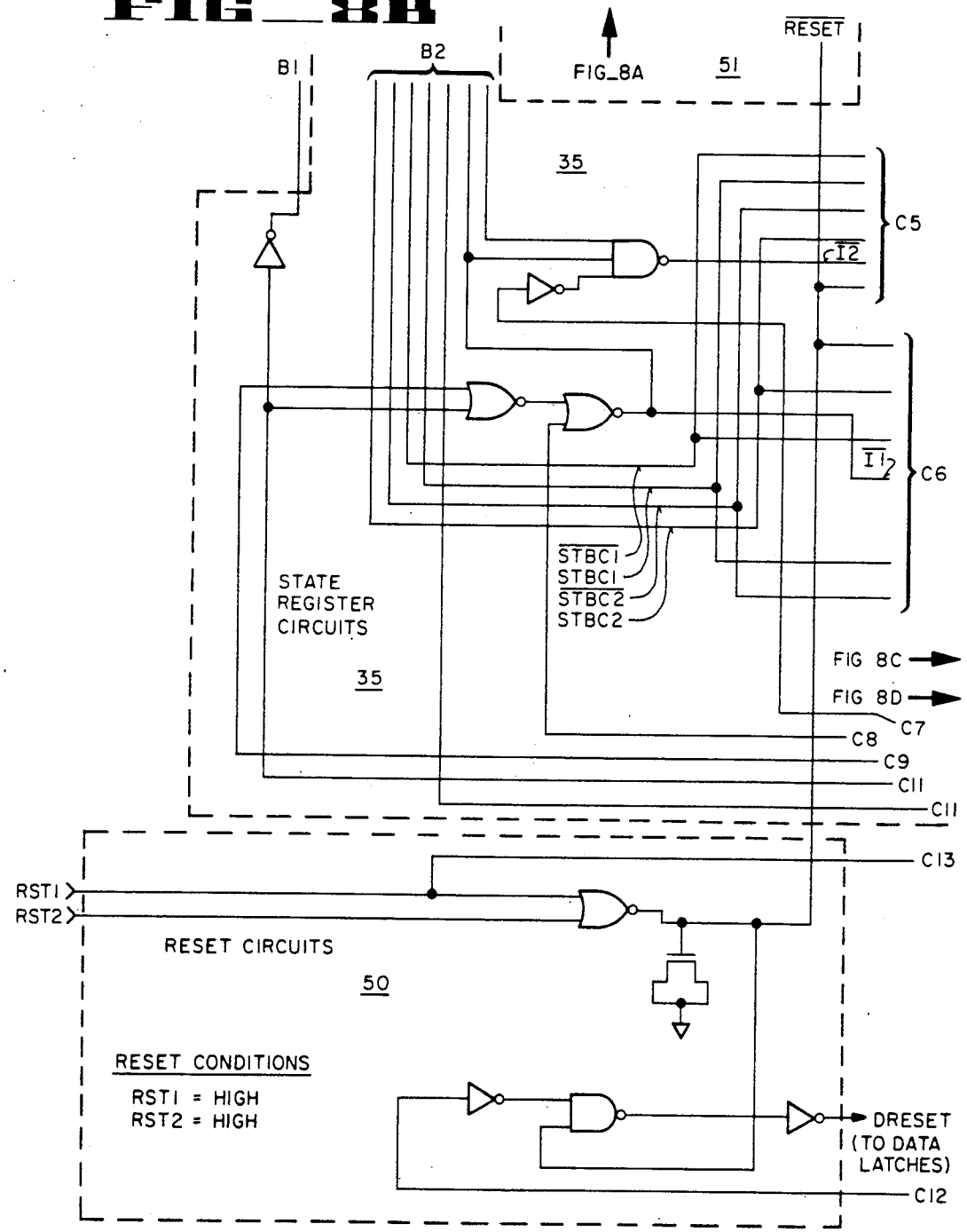

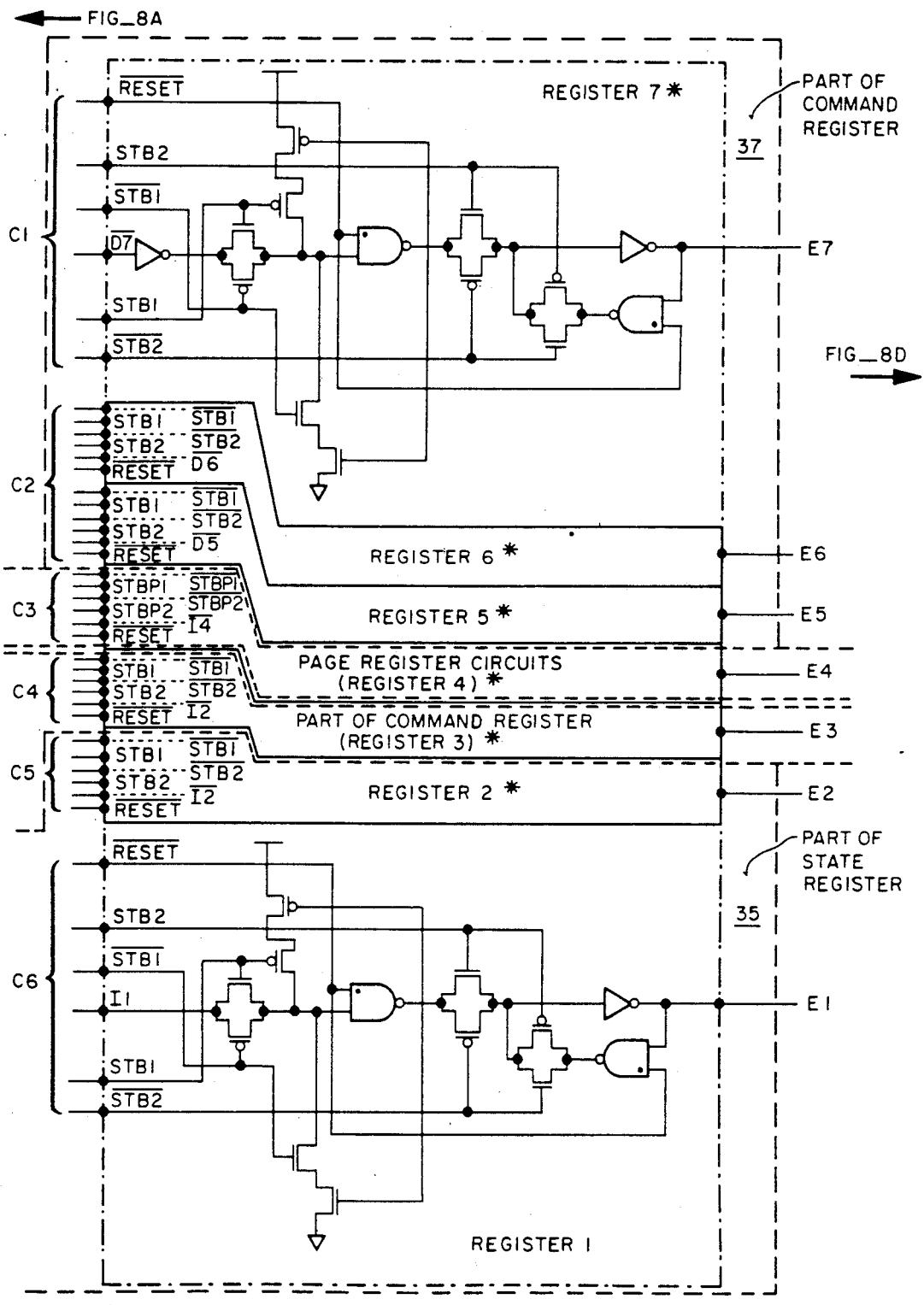
FIG_8C

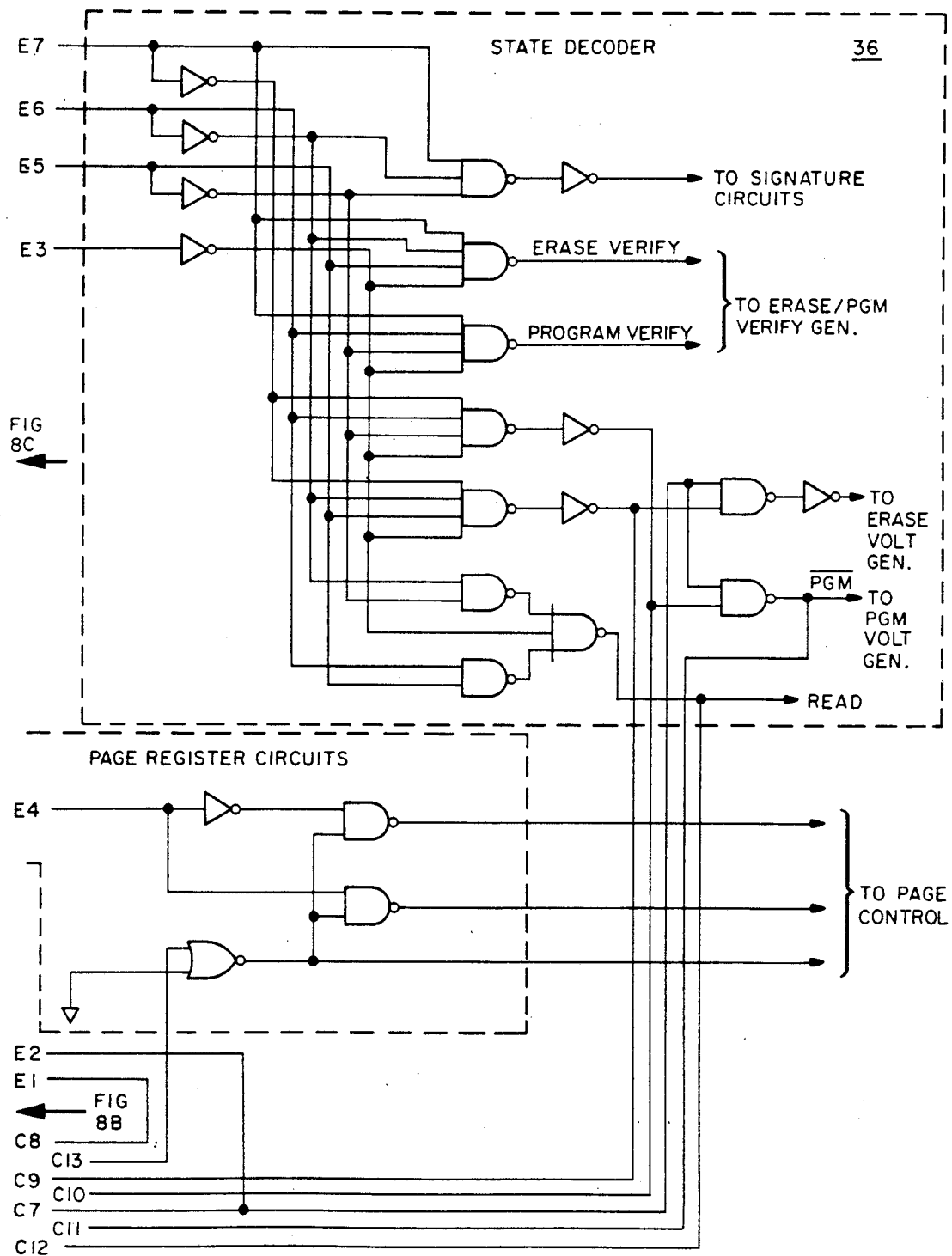
FIG_8D

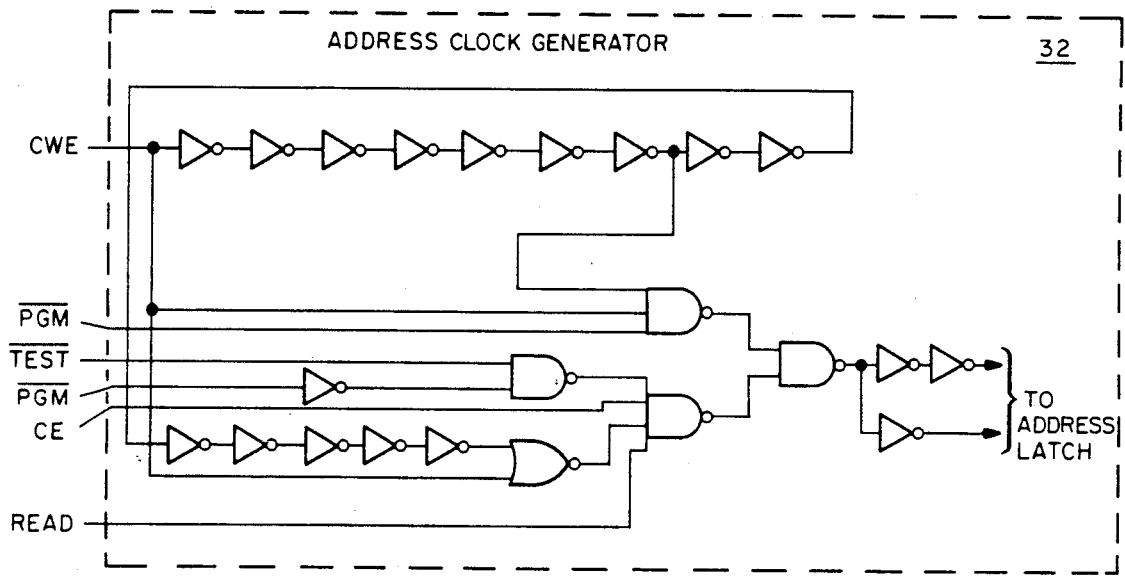
FIG_9
| REGISTER INPUTS | | | |
|---|---|---|---|
| R7 | R6 | R5 | MODES |
| 0 | 0 | 0 | READ |
| 0 | 0 | 1 | ERASE |
| 0 | 1 | 0 | PROG |
| 0 | 1 | 1 | READ |
| 1 | 0 | 0 | SIG/READ |
| 1 | 0 | 1 | ER VERIFY |
| 1 | 1 | 0 | PGM VERIFY |
| 1 | 1 | 1 | READ |

PROGRAM/ERASE SELECTION FOR FLASH MEMORY

BACKGROUND OF THE INVENTION

1. Field of the Invention

The present invention relates to the field of metal-oxide-semiconductor (MOS) electrically programmable and electrically erasable read-only memories (EEPROMs) and to electrically programmable read-only memories (EPROMs) having floating gates.

2. Related Applications

This application relates to copending application Ser. No. 892,446, filed Aug. 4, 1986, and entitled LOW VOLTAGE EEPROM CELL; copending application Ser. No. 07/144567, filed 1-12-88, entitled VOLTAGE MARGINING CIRCUIT FOR FLASH EPROM; copending application Ser. No. 07/144569, filed 1-12-88, entitled LOAD LINE FOR FLASH EPROM; copending application Ser. No. 07/157364, filed 2-17-88, entitled LEAKAGE VERIFICATION FOR FLASH EPROM; copending application Ser. No. 07/157362, filed 2-17-88, entitled PROCESSOR CONTROLLED COMMAND PORT ARCHITECTURE FOR FLASH MEMORY; all assigned to the assignee of the present invention.

3. Prior Art

The most commonly used EPROM cell has an electrically floating gate which is completely surrounded by insulation and generally disposed between a source and drain region formed in a silicon substrate. In earlier versions of these cells, charge is injected through the insulation by avalanche injection such as the device described in U.S. Pat. No. 3,660,819. Later versions of EPROMs relied on channel injection for charging the floating gate as described in U.S. Pat. Nos. 4,142,926; 4,114,255 and 4,412,310. These EPROMs are erased by exposing the array to ultraviolet radiation.

Electrically erasable EPROMs (EEPROMs) are also commercially available. In some cases, charge is placed into and removed from a floating gate by tunnelling the charge through a thin oxide region formed on the substrate (See U.S. Pat. No. 4,203,158). In other instances, charge is removed through an upper electrode (See U.S. Pat. No. 4,099,196).

These EEPROM cells do not lend themselves to being reduced in substrate area as do the EPROM cells. Various techniques have been implemented to reduce the size of the memory array by providing higher-density cells. One such technique is disclosed in U.S. Pat. No. 4,432,075. Further, U.S. Pat. No. 4,266,283 discloses the arrangement of an EEPROM into an array and selection of various functions to be performed on the memory array.

EPROM memories are most often removed from their printed circuit boards for both erasing and programing. A special programming device is used for programming the cells. This device also verifies that the cells have been properly erased and programed. During programing, electrons are transferred to the floating gate making the cells less conductive. The operation of these EPROM devices are well-known.

EEPROMs are different than EPROMs in that EEPROMs are typically programmed and erased while installed in the same circuit (e.g., printed circuit board) used for reading data from the memory. That is, a special programming device is not used. In some cases "on-chip" circuits are used to verify that the programming has been properly performed. U.S. Pat. No. 4,460,982 discloses an intelligent EEPROM which provides means for both programming and erasing.

More recently, a new category of electrically erasable EPROMs/EEPROMs has emerged and these devices are sometimes referred to as "Flash" EPROMs or EEPROMs. In these flash memories, the entire array is simultaneously erased, electrically. The cells themselves use only a single device per cell and such cell are described in the fore-mentioned copending application Ser. No. 892,446. Another relevant art is an article entitled "A 256-kbit Flash $E^2PROM$ Using Triple-Polysilicon Technology", Masuoka et al., IEEE Journal of Solid-State Circuits, Vol. SC-22, No. 4, August, 1987. The present invention is directed towards the use of these cells.

Electrically erasing flash memory devices gives rise to another problem, specifically over-erasing. Too much charge can be removed, making the device "depletion-like". Cells may require testing after being erased to verify that the floating gate is erased, but not too positively charged.

Another problem is encountered when in circuit erasing is used on the flash memories. Additional signal/command lines are needed to provide for the erasing and programming of the flash memory. Typically additional lines, which require additional pins on a memory chip, are not a problem when designing new circuits, boards, systems, etc. However, for the flash memories to be used in place of existing EPROMs/EEPROMs, pin-to-pin compatibility is a must requirement. Because additional control lines for erasing and programming are needed, a direct pin-to-pin compatibility cannot be achieved unless certain architectural changes are made within the flash memory device which permits the erasing and reprogramming.

SUMMARY OF THE PRESENT INVENTION

The present invention provides for a command port architecture for programming and erasing flash memory devices through a data port. In order to provide in circuit erasing, programming and erase/program verification, circuit means is incorporated on the same semiconductor chip which contains the memory. A command port controller is coupled to accept instructions from a data line coupled to an associated processor. Instructions written into the command port controller provide the necessary command to generate control signals for erasing and programming the memory as well as verifying the contents after the erase and program operations have been performed.

The command port is comprised of a command port controller, data registers coupled to a data bus to accept programming data; and address registers coupled to the address bus to accept address information during program and verify. The command port controller is comprised of command and state registers coupled to the data bus to accept command instructions from a microprocessor; clock generators for generating necessary timing; and a state decoder for decoding the instructions inputted to the command and state registers.

Further, the controller provides an erase algorithm and a programming algorithm to erase and program the memory. The erase algorithm provides the necessary voltages to erase the flash memory cells and then verifies that the memory is erased. The erase cycle is monitored and repeated with each erase pulse having a predetermined pulsewidth which is incremented until erase is achieved. However, an error is detected when a maximum pulse count is reached and full erasing of the memory has not occurred.

Equivalently, during the programming of the memory the algorithm provides for programming each location of the memory and verifying its contents after the programming. The programming cycle is monitored and repeated with each programming pulse having a predetermined pulsewidth until programming is achieved. However if programming cannot be achieved after a predetermined maximum pulse count then a programming error is noted.

BRIEF DESCRIPTION OF THE DRAWINGS

FIG. 2 is a block diagram schematic of a command port controller of the present invention.

FIG. 3 is a timing diagram for a read cycle of the present invention.

FIG. 4 is a timing diagram for an erase cycle of the present invention.

FIG. 5 is a timing diagram for a programming cycle of the present invention.

FIG. 6 is a flowchart diagram for an erase cycle of the present invention.

FIG. 7 is a flowchart diagram for a programming algorithm of the present invention.

FIGS. 8a, 8b, 8c, 8d and is a schematic diagram of the command port controller shown in FIG. 2.

FIG. 9 is a truth table for determining the mode of operation from three command instruction bits.

DETAILED DESCRIPTION OF THE PRESENT INVENTION

Figure 1:
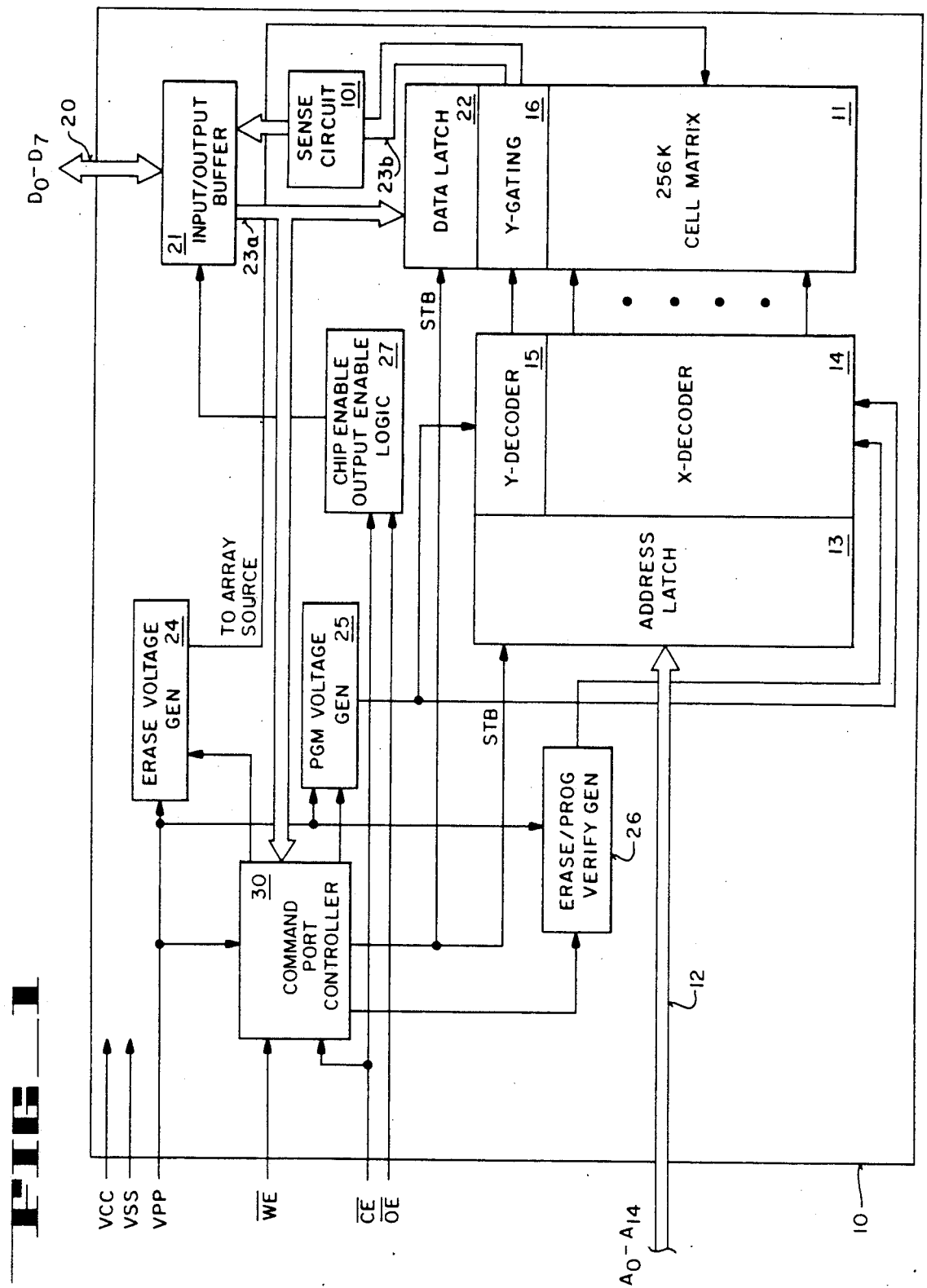
FIG. 1 is a block diagram schematic of a flash memory device of the present invention.

A command port architecture which provides for a microprocessor control of program, erase, program verify, erase verify and read modes for use with a flash memory is described. In the following description, numerous specific details are set forth, such as specific circuit configuration, components, etc., in order to provide a thorough understanding of the present invention. It will be obvious, however, to one skilled in the art that the present invention may be practiced without these specific details. In other instances, well-known processes, architecture and circuits have not been described in detail in order not to unnecessarily obscure the present invention.

The preferred embodiment of the present invention is used in conjunction with a particular double-poly, single-transistor, electrically erasable, programmable flash memory which is also referred to as a flash EPROM. It is a high-density non-volatile flash memory optimized for microprocessor controlled reprogramming capability. This particular flash EPROM uses an advanced complementary metal oxide semiconductor (CMOS) 1.5 μm technology, providing a 32,768×8 bits having 6 μm by 6 μm cell fabricated on a 192-mil square die. Although a particular 256K-bit flash EPROM is described, it is to be appreciated that other memory sizes and other memory technology can use the invention described herein.

The non-volatile flash EPROM of the present invention is based on the EPROM technology. The memory cell uses equivalent programming mechanism as an EPROM, but can be electrically erased. Electrical erasure of the flash memory is achieved using a high quality tunnel oxide under a single transistor, floating polysilicon gate cell. The flash cell requires a 12 volt power supply for erase and program. The erase mechanism utilizes Fowler-Nordheim tunnelling to move electrons from the floating gate to the cell source junction. Programming is achieved in the standard EPROM manner of hot electron injection from the cell drain junction to the floating gate. The flash EPROM cell used with the present invention is described in the prior art references cited in the earlier background section of the application.

Without the use of specialized circuit a direct pin-for-pin compatibility cannot be achieved between the flash EPROM and prior art memory devices. In order to maintain pin-to-pin compatibility between the flash EPROM and the prior art EPROM device, the present invention provides for a specialized command port architecture which permits in circuit erasing and programming. The command port architecture of the present invention allows microprocessor control of program, erase, program/erase verify, and read modes while still maintaining pin-to-pin compatibility with the prior art EPROMs/EEPROMs. This specialized architecture is implemented in a circuit which is built into a semiconductor chip incorporating the flash memory.

Referring to FIG. 1, a flash EPROM semiconductor device 10 of the present invention is shown. An address bus 12 couples address bits A0–A14 to address latch 13. Although 15 bits are used to provide an address on bus 12, the actual number of address bits is arbitrary. Address latch 13 is coupled to X-decoder 14 and Y-decoder 15. X-decoder 14 is coupled to memory array 11 and Y-decoder 15 is coupled to Y-gating circuit 16. The memory 11 of the preferred embodiment is a 256K bit cell array structure wherein X-decoder 14 provides the decoding to access the X (row) addressing and Y-decoder 15 provides decoding for the Y (column) addressing of the X-Y matrix of memory array 11. The arrangement of the memory array 11 and the accessing of such an array by the use of X and Y-decoders 14 and 15 and column gating circuitry 16 are well-known in the prior art EPROMs.

Data is coupled to device 10 by an 8-bit bidirectional data bus 20, but again the number of bits on data bus 20 is a design choice. Data bus 20 is coupled to an input-/output (I/O) buffer 21, wherein data being inputted to memory 11 is coupled through data latch 22 on bus 23a. Conversely data from memory 11 which is to be outputted on data bus 20 is coupled through sensing circuits 101, through bus 23b, to I/O buffer 21 for output onto data bus 20. Incoming data is also coupled to command port controller 30 on bus 23a. Command port controller 30 also receives external signals $\overline{WE}$ and $\overline{CE}$ and provides control signals to address latch 13, data latch 22, erase voltage generator 24, program voltage generator 25, and erase/program verify generator 26. External signals $\overline{CE}$ and external $\overline{OE}$ are coupled to a chip/output enable logic circuit 27. These data, address and control signals originate from a microprocessor, which is typically used in conjunction with semiconductor memories.

Supply voltage VCC and its return VSS are coupled to device 10, as well as programing voltage VPP which voltage value determines if the command port controller 30 is enabled to select read, erase or program functions. VPP is coupled to command port controller 30, erase voltage generator 24, program voltage generator 25 and erase/program verify generator 26. The origination of these voltages is irrelevant to the practice of the present invention.

Chip/output enable logic circuit 27 is coupled to I/O buffer 21. Circuit 27 provides the control signals to buffer 21. Erase voltage generator 24 is coupled to memory 11 for providing the necessary voltage to simultaneously erase memory array 11. Output of program voltage generator 25 is coupled to decoders 14 and 15 to provide program voltage to memory 11 when the program function output of erase/program verify generator 26 is coupled to X decoder 14 to provide verify voltage to memory 11 when the erase/program verify function is selected.

In order to provide in circuit erasure and programing of memory 11, device 10 of the preferred embodiment is designed to accept such commands on data line 20 from the processor coupled to device 10. Whenever device 10 is to be selected, chip enable signal $\overline{CE}$ goes low and chip 10 is prepared to receive mode instructions on data bus 20. Instructions pass through I/O buffer 21 to command port controller 30. Command port controller 30 receives one of $2^n$ instructions (where n is the number of data bits) from data bus 20, including the following six instructions program, program verify, erase, erase verify, read, and signature read (a specialized read function to match memory 11 to appropriate external equipment protocol). Depending on which instruction word is received, the command port controller 30 generates control signals for providing the appropriate corresponding operation. After a particular instruction is inputted to command port controller 30, write enable signal $\overline{WE}$, chip enable signal $\overline{CE}$ and output enable signal $\overline{OE}$ control the generation of various signals from command port controller 30 and logic circuit 27 for proper operation of the various units of device 10.

In the preferred embodiment, command port controller 30 is activated when VPP is at an approximate voltage value of 12 volts DC. If however deactivation of command port controller 30 is desired, then a shift of the value of VPP from 12 volts to approximately 5 volts will deactivate command port controller 30. Whenever VPP transitions to 5 volts, controller 30 is deactivated, such that array instruction on data bus 20 which is intended for controller 30, is ignored. Whenever VPP is at 5 volts and controller 30 is deactivated, device 10 will function only in a read mode. This controller 30 deactivation scheme was provided in chip 10 of the preferred embodiment, in the event device 10 is used as a direct replacement of a prior art EPROM (or EEPROM which is being utilized for read operation only) in which 12 v is not present. In such prior art EPROMs VPP is typically at 5 volts wherein a direct replacement of device 10 for a prior art EPROM will cause device 10 to provide read mode only. This controller deactivation scheme also provides absolute protection against inadvertent erase or program of the memory when VPP is at 5 volts.

Referring to FIG. 2, it shows a block diagram schematic of the command port controller 30 of the preferred embodiment. Chip enable signal $\overline{CE}$ is coupled to control logic 31 and address clock generator 32. Write enable signal $\overline{WE}$ is coupled as an input to control logic 31. Control logic 31 permits signal $\overline{WE}$ to be coupled to address clock generator 32, state clock generator 33, and command/data clock generators 34 only when chip enable signal $\overline{CE}$ activates chip 10. Output of state clock generator 33, as well as data on data bus 23a, are coupled to state register 35, which output is coupled to state decoder 36 and command clock generator 34a. The output of command clock generator 34a is coupled to command register 37. Command register 37 also receive data from data bus 23a and the output of command register 37 is coupled to state decoder 36. The output of address clock generator 32 provides the strobe to address latch 13 of FIG. 1 and data clock generator 34b provides the strobe to data latch 22 of FIG. 1. Outputs from state decoder 36 are coupled back to control address clock generator 32 and state register 35. Other outputs from state decoder 36 are provided to erase voltage generator 24, program voltage generator 25, and erase/program verify generator 26 shown in FIG. 1. State register 35 provides a feedback signal to command clock generator 34a, but command register 37 has no such feedback.

Functions are selected via data bus 23a in a write cycle controlled by the signals $\overline{WE}$ and $\overline{CE}$. Contents of the address latch 13 are updated on the falling edge of $\overline{WE}$. The rising edge of signal $\overline{WE}$ causes instructions to be loaded into the state register 35 and either command register 37 or data latch 22. State decoder 36 decodes new internal modes and initiates appropriate operations by providing corresponding control signals. Control lines from state decoder 36 to erase voltage, program voltage and erase/program verify generators 24, 25, 26, respectively, causes these generators to provide VPP voltages to X-Y decoders 14 and 15 or memory 11 as is shown in FIG. 1. Verify voltages derived from VPP are applied to the word lines through the X-decoder during program verify and erase verify to guarantee program and erase margin.

Also referring to FIGS. 3, 4 and 5, these figures illustrate timing sequences of various signals associated with device 10. FIG. 3 shows a read function wherein memory 11 is addressed and data is read from memory 11 when output enable signal $\overline{OE}$ activates circuit 27, which then activate the output function of buffer 21.

FIG. 4 illustrates the timing cycle for an erase operation. Erase is achieved by a two-write sequence with the erase code written to the command register 37 and state register 35 on a first write cycle 40, and the erase confirm code written to the state register 35 on a second write cycle 41. The confirm code initiates erase upon the rising edge of the second cycle 41 of signal $\overline{WE}$. The state decoder 36 initiates a command to erase voltage generator 24 which then triggers a high voltage switch connecting 12 volts (VPP) to the source of all array cells of memory 11. It also grounds all word lines. Fowler-Nordheim tunnelling results in the simultaneous erasure of all cells of memory array 11. Writing the erase verify code to the registers 35 and 37 at write cycle 42 terminates erase, latches the address of the byte to verify and sets up internal erase margin voltages. A microprocessor can then access the output of the memory from the address accessed using standard read timing when signal $\overline{OE}$ goes low at time 43. The verify procedure is then repeated for all addresses.

Programming is executed in a manner shown in FIG. 5. The program command is entered into registers 35 and 37 on the first cycle 45 of write enable signal $\overline{WE}$. A second $\overline{WE}$ cycle 46 loads the address latch 13 and data latch 22. The rising edge of the second $\overline{WE}$ cycle 46 initiates programming by causing state decoder 36 to generate a control signal to program voltage generator 25, which then applies high voltage VPP to the gate and drain of the addressed cell of memory 11. Writing the program verify command to registers 35 and 37 at $\overline{WE}$ cycle 47 terminates programming and sets internal margin voltages to verify the newly programed byte. Again the addressed byte can be accessed using standard microprocessor read timings and when $\overline{OE}$ goes low at time 48.

Referring to FIG. 6, it shows a flowchart diagram of the erase algorithm utilized by the command port controller 30. During the initialization phase VPP is applied, all bytes are programmed to a particular value, in this case 00H (preconditioning), and counters are preset to a predetermined initialization value. Then the set up erase command is written followed by the writing of the erase command (see FIG. 4 for the timing diagram). After a time-out period during which erase is achieved, the erase verify command is written and followed by another predetermined time out ($6\mu$ sec in this instance).

Then, data is read from memory and checked to determine if the data has been erased. If the data has not been erased, then the pulsewidth for erasing the data is incremented by a predetermined value and stored in the TEW counter and checked for a maximum limit value (CUMTEW and TEW calculations are shown in FIG. 6). In the preferred embodiment pulsewidth is incremented to a maximum limit value for a cumulative erase time of 10 seconds. After each increment, the sequence is repeated through the write erase set up command and the write erase command again. However if the data has not been erased after a predetermined pulse count (in this example the value of 64 has been set), then an error is noted, signifying that an erasure cannot be achieved for that memory cell. Whenever data is read and is found to be erased, the address is incremented and the erase verify sequence is repeated until the last address has been verified, in which case a read command is written to the command and state registers to reset the registers for a read operation, and the erase cycle is completed. If a byte fails to verify as erased, pulsewidth TEW is incremented and the erase sequence is repeated. Erase efficiency is also achieved by starting recycling of verification from the last byte erased and verified.

Referring to FIG. 7, a flowchart for a programing algorithm is shown. The programming cycle is initialized by applying VPP and initializing the pulse counter. Then the set up program command is written to the command and state registers followed a second write cycle which latches the address and the data (see FIG. 5 for the timing diagram). After a predetermined time-out period in which programming is achieved, the program verify command is written. Again after a predetermined time-out period ($6\mu$ sec in this example) data is read from memory to verify the programmed data. If the written data does not correspond to the data read from the memory pulse count is incremented to increase the programming time and the write and read sequences are repeated. In the present embodiment, the programming time is increased by repeating $100\mu$ sec pulses to a maximum pulse count of 25. Each increment of the pulse count increases the duration of the programming period until the predetermined value, in this case 25, is reached at which point error is detected. If the read data is verified to be correct then the address is incremented and the sequence repeated to write and read data from each of the other address. When the last address has been reached, an instruction is written to the state and command registers to reset the register for a read operation. The algorithm of FIG. 7 is also used to load $\emptyset\emptyset$ for preconditioning prior to erase of FIG. 6.

Although various prior art circuits can be implemented to perform the block shown in FIG. 2, FIGS. 8a–e show a particular circuit as used in the preferred embodiment to provide the various blocks of FIG. 2. Reference numerals to the various blocks of FIG. 2 correspond to the references of FIGS. 8a–e. In addition, reset circuit 50 and page register circuits 51 are shown. The reset is to reset the command and state registers, such as during power up or when VPP is at 5 v. The page register circuit 51 is to control the page mode addressing of the memory. Further, control circuit 31 is not shown in specificity because control circuit 31 basically ANDs the chip enable and the write enable signals. The resultant signal is represented as CWE.

The preferred embodiment utilizes a series of inverters to provide the delay for generating the strobe to the address latch from address clock generator 32. As used in the specific circuit of the preferred embodiment, command register 37 is comprised of four separate registers R3, R5, R6 and R7. Registers R5, R6 and R7 are utilized for mode selection and R3 register is used to decode and latch invalid inputs. There are two registers in the state register 35. Register R2 is used with feedback control to activate erase and program state register R1 is used to control data input flow to data latches or the command registers. The command and data clock generators 34a and 34b have the function of creating the non-overlapping clock phases needed by the registers and the data latches. These clocks control the latching of input data during a write cycle into the program data latches, command registers and state registers.

The address clock generator is responsible for controlling the flow of address information to the address latches. The state registers 35 and command registers 37 provide the heart of the command port architecture, receive input from the data input buffer and store the data to decode modes of operation for the chip. The command instructions are determined by three data bits to registers 5, 6 and 7 and the truth table for determining the mode of operation from these bits is shown on FIG. 8e. The command registers have no feedback from their outputs and keep track of single write modes and select entry to multiple write modes. The state registers have a feedback path from their output to their inputs and keep track of the chip's sequential operation when it goes through the various stages of the multiple write modes.

In the event device 10 is to be made compatible with existing EPROM devices the write enable signal is multiplexed with the most significant address bit A14. When VPP is at 5 volts A14/$\overline{WE}$ pin reads the most significant address bit (A14), which in some instances is used to select page mode. However when VPP is at a programming voltage (12 volts in this instance) the signal on A14/$\overline{WE}$ pin is read as a write enable signal. Therefore by multiplexing the most significant address bit with the write enable signal, the multiplexing scheme permits device 10 of the present invention to be pin compatible with existing EPROM devices.

Thus, a command port architecture for programming and erasing flash EPROMs/EEPROMs is described.

We claim:

1. An improved type of erasable and programmable read-only memory fabricated on a silicon substrate and employing a plurality of memory cells each of which has a floating gate and employing fixed numbers of data, address and control lines, wherein said data lines provide a bus for transporting data to and from said memory cells, wherein the improvement comprises using said fixed number of data lines to enter program and erase instructions as data to a port controller on said substrate, said port controller generating appropriate control signals for programming and erasing said memory cells electrically, said erasing accomplished by a method comprising the steps of:

(a) writing an erase setup command to said port controller during a first write cycle, said command originating from a microprocessor;

(b) writing an erase command to said port controller during a second write cycle, said command originating from said microprocessor;

(c) erasing said memory cells using an erase pulse during an erase cycle by one of said control signals from said port controller, said erase pulse having a predetermined pulsewidth;

(d) writing an erase verify command to said port controller during a third write cycle and providing a designated address to access a location in said memory, said command and address location originating from said microprocessor;

(e) generating verify voltages in said memory for reading contents of said location in memory, said verify voltages acting as reference voltages set to a predetermined level, such that said contents of said location are compared with said verify voltages to determine if said location is erased, said verify voltages generated under control of said port controller; and if said location is not erased then incrementing said pulsewidth of said erase pulse of said erase cycle and under control of said microprocessor repeating steps (a) through (e) until said location is erased;

(f) repeating steps (d) and (e) until all address locations are erased and verified.

2. The method defined in claim 1, wherein if said erase cycle exceeds a predetermined length, said port controller produces an error message for said microprocessor.

3. The method defined in claim 2, wherein an address register maintains location of last location verified in step (e) to prevent duplicating verification of verified locations, said location being incremented and stored in said address register under control of said port controller.

4. An improved type of erasable and programmable read-only memory fabricated on a silicon substrate and employing a plurality of memory cells each of which has a floating gate and employing fixed numbers of data, address and control lines, wherein said data lines provide a bus for transporting data to and from said memory cells, wherein the improvement comprises using said fixed number of data lines to enter program and erase instructions as data to a port controller on said substrate, said port controller generating appropriate control signals for programming and erasing said memory cells electrically, said programming accomplished by a method comprising the steps of:

(1a) writing a programming set-up command to said port controller during a first write cycle, said command originating from a microprocessor;

(1b) latching address and data to said memory during a second write cycle by one of said control signals from said port controller;

(1c) programming said memory during a programming cycle by one of said control signals from said port controller;

(1d) writing a program verify command to said port controller during a third write cycle, said command originating from said microprocessor;

(1e) generating verify voltages in said memory for reading contents from a memory location in which data was programmed in step (1c), said verify voltages acting as reference voltages set to a predetermined level, such that said contents of said location are compared with said verify voltages to verify its contents, said verify voltages generated under control of said port controller; and if said location is not programmed, then under control of said microprocessor repeating steps (1a) through (1e) until said location is programmed;

(1f) repeating steps (1a) through (1e) for a new address until all address locations are programmed and verified, the programmed locations being incremented and stored in a memory location under control of said port controller.

5. An improved type of erasable and programmable read-only memory fabricated on a silicon substrate and employing a plurality of memory cells each of which has a floating gate and employing fixed numbers of data, address and control lines, wherein said data lines provide a bus for transporting data to and from said memory cells, wherein the improvement comprises using said fixed number of data lines to enter program and erase instructions as data to a port controller on said substrate, said port controller generating appropriate control signals for programming and erasing said memory cells electrically, said erasing and programming accomplished by a method comprising the steps of:

(1a) writing an erase setup command to said port controller during a first write cycle, said command originating from a microprocessor;

(1b) writing an erase command to said port controller during a second write cycle, said command originating from said microprocessor;

(1c) erasing said memory cells using an erase pulse during an erase cycle by one of said control signals from said port controller, said erase pulse having a predetermined pulsewidth;

(1d) writing an erase verify command to said port controller during a third write cycle and providing a designated address to access a location in said memory, said command and address originating from said microprocessor;

(1e) generating verify voltages in said memory for reading contents of said location in memory, said verify voltages acting as reference voltages set to a predetermined level, such that said contents of said location are compared with said verify voltages to determine if said location is erased, said voltages generated under control of said port controller; and if said location is not erased then incrementing said pulsewidth of said erase pulse of said erase cycle and under control of said microprocessor repeating steps (1a) through (1e) until said location is erased;

(1f) repeating steps (1d) and (1e) until all address locations are erased and verified, the erased locations being incremented and stored in a memory location under control of said port controller;

(2a) writing a programming set-up command to said port controller during a fourth write cycle, said command originating from said microprocessor;

(2b) latching address and data to said memory during a fifth write cycle by one of said control signals from said port controller;

(2c) programming said memory during a programming cycle by one of said control signals from said port controller;

(2d) writing a program verify command to said port controller during a sixth write cycle, said command originating from said microprocessor;

(2e) generating verify voltages in said memory for reading contents from a memory location in which data was programmed in step (2c), said verify voltages acting as reference voltages set to a predetermined level, such that said contents of said location are compared with said verify voltages to verify its contents, said voltages generated under control of said port controller; and if said location is not programmed, then under control of said microprocessor repeating steps (2a) through (2e) until said location is programmed;

(2f) repeating steps (2d) through (2e) for a new address until all address locations are programmed and verified, the programmed locations being incremented and stored in a memory location under control of said port controller.

6. An improved type of erasable and programmable read-only memory fabricated on a silicon substrate and employing a plurality of memory cells each of which has a floating gate and employing fixed numbers of data, address and control lines, wherein said data lines provide a bus for transporting data to and from said memory cells, wherein the improvement comprises using said fixed number of data lines to enter program and erase instructions as data to a port controller on said substrate, said port controller generating appropriate control signals for preconditioning, programming and erasing said memory cells electrically, said preconditioning, erasing and programming accomplished by a method comprising the steps of:

(1) preconditioning said memory by programming bytes of said memory to a predetermined value to prevent over-erasing;

(2a) writing an erase setup command to said port controller during a first write cycle, said command originating from a microprocessor;

(2b) writing an erase command to said port controller during a second write cycle, said command originating from said microprocessor;

(2c) erasing said memory cells using an erase pulse during an erase cycle by one of said control signals from said port controller, said erase pulse having a predetermined pulsewidth;

(2d) writing an erase verify command to said port controller during a third write cycle and providing a designated address to access a location in said memory, said command and address location originating from said microprocessor;

(2e) generating verify voltages in said memory for reading contents of said location in memory, said verify voltages acting as reference voltages set to a predetermined level, such that said contents of said location are compared with said verify voltages to determine if said location is erased, said voltages generated under control of said port controller; and if said location is not erased then incrementing said pulsewidth of said erase pulse of said erase cycle and under control of said microprocessor repeating steps (2a) through (2e) until said location is erased;

(2f) repeating steps (2d) and (2e) until all address locations are erased and verified, the erased locations being incremented and stored in a memory location under control of said port controller;

(3a) writing a programming setup command to said port controller during a fourth write cycle, said command originating from said microprocessor;

(3b) latching address and data to said memory during a fifth write cycle by one of said control signals from said port controller;

(3c) programming said memory during a programming cycle by one of said control signals from said port controller;

(3d) writing a program verify command to said port controller during a sixth write cycle, said command originating from said microprocessor;

(3e) generating verify voltages in said memory for reading contents from a memory location in which data was programmed in step (3c), said verify voltages acting as reference voltages set to a predetermined level, such that said contents of said location are compared with said verify voltages to verify its contents, said voltages generated under control of said port controller; and if said location is not programmed, then under control of said microprocessor repeating steps (3a) through (3e) until said location is programmed;

(3f) repeating steps (3a) through (3e) for a new address until all address locations are programmed and verified, the programmed locations being incremented and stored in a memory location under control of said port controller.

* * * * *